US008256901B2

(12) United States Patent
Lim et al.

(10) Patent No.: US 8,256,901 B2
(45) Date of Patent: Sep. 4, 2012

(54) IMAGE PROJECTION APPARATUS AND METHOD OF COOLING AN IMAGE PROJECTION APPARATUS

(75) Inventors: Seon-woo Lim, Suwon-si (KR); Won-nyun Kim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 587 days.

(21) Appl. No.: 11/390,450

(22) Filed: Mar. 28, 2006

(65) Prior Publication Data

US 2006/0290893 A1  Dec. 28, 2006

(30) Foreign Application Priority Data

Apr. 21, 2005  (KR) ........................ 10-2005-0033186

(51) Int. Cl.
G03B 21/18  (2006.01)
(52) U.S. Cl. ............. 353/60; 353/57; 348/748; 348/749
(58) Field of Classification Search ..................... 353/52, 353/54, 55, 56, 57, 58, 59, 60, 61; 348/748, 348/749; 165/104.13, 104.14, 104.33
See application file for complete search history.

(56) References Cited

U.S. PATENT DOCUMENTS

| | | | |
|---|---|---|---|
| 5,170,195 A | 12/1992 | Akiyama et al. | |
| 5,283,715 A * | 2/1994 | Carlsten et al. | 361/702 |
| 5,960,865 A | 10/1999 | Costa et al. | |
| 6,031,716 A | 2/2000 | Cipolla et al. | |
| 6,137,682 A * | 10/2000 | Ishimine et al. | 361/704 |
| 6,224,216 B1 * | 5/2001 | Parker et al. | 353/31 |
| 6,231,191 B1 | 5/2001 | Shiraishi et al. | |
| 6,350,033 B1 | 2/2002 | Fujimori | |
| 6,428,170 B1 | 8/2002 | Haba | |
| 6,447,121 B1 | 9/2002 | Woo | |
| 6,751,027 B2 | 6/2004 | Van Den Bossche et al. | |
| 6,781,835 B2 | 8/2004 | Hashimoto et al. | |
| 6,816,375 B2 | 11/2004 | Kalyandurg | |
| 6,914,783 B2 | 7/2005 | Rogers et al. | |
| 6,937,474 B2 | 8/2005 | Lee | |
| 6,956,740 B2 | 10/2005 | Shimura et al. | |
| 6,961,243 B2 | 11/2005 | Shih-Tsung | |
| 6,991,335 B2 | 1/2006 | Kondo et al. | |
| 7,064,956 B2 * | 6/2006 | Patel | 361/697 |
| 7,072,184 B2 | 7/2006 | Kalyandurg | |

(Continued)

FOREIGN PATENT DOCUMENTS

CN  1516273  7/2004

(Continued)

OTHER PUBLICATIONS

PCT Search Report dated Jul. 20, 2006 issued in KR 2006-1494.

(Continued)

*Primary Examiner* — Francis M Legasse, Jr.
*Assistant Examiner* — Bao-Luan Le
(74) *Attorney, Agent, or Firm* — Stanzione & Kim, LLP

(57) ABSTRACT

An apparatus and method of cooling an image projecting apparatus. The image projecting apparatus includes a main body frame, at least one heat generating unit, a heat dispersion part, at least one heat transfer member, and a single cooling fan, where the first side of the at least one heat transfer member is connected to the at least one heat generating unit, and a second side of the at least one heat transfer member is connected to the heat dispersion part.

24 Claims, 6 Drawing Sheets

U.S. PATENT DOCUMENTS

| | | | |
|---|---|---|---|
| 7,084,931 B2 | 8/2006 | Tabuchi et al. | |
| 7,151,670 B2 | 12/2006 | Rogers et al. | |
| 7,152,979 B2 | 12/2006 | Ellis et al. | |
| 7,172,291 B2 | 2/2007 | Kitabayashi | |
| 7,175,283 B2* | 2/2007 | Kitabayashi et al. | 353/54 |
| 7,216,988 B2 | 5/2007 | Kitabayashi | |
| 7,252,385 B2* | 8/2007 | Engle et al. | 353/52 |
| 7,264,359 B2 | 9/2007 | Kawahara et al. | |
| 7,334,898 B2 | 2/2008 | Seto et al. | |
| 7,384,151 B2 | 6/2008 | Seki | |
| 7,384,152 B2 | 6/2008 | Takeuchi | |
| 2002/0181200 A1* | 12/2002 | Chang | 361/687 |
| 2003/0056941 A1* | 3/2003 | Lai et al. | 165/104.33 |
| 2003/0063247 A1 | 4/2003 | Kalyandurg | |
| 2003/0121645 A1* | 7/2003 | Wang | 165/104.26 |
| 2003/0133080 A1* | 7/2003 | Ogawa et al. | 353/31 |
| 2003/0189815 A1 | 10/2003 | Lee | |
| 2004/0037039 A1* | 2/2004 | Shimura et al. | 361/700 |
| 2004/0100769 A1 | 5/2004 | Chung et al. | |
| 2005/0046801 A1 | 3/2005 | Yamada | |
| 2005/0073658 A1 | 4/2005 | Chang et al. | |
| 2005/0103477 A1* | 5/2005 | Kim et al. | 165/104.33 |
| 2005/0122482 A1* | 6/2005 | Ellis et al. | 353/61 |
| 2005/0128441 A1* | 6/2005 | Morgan | 353/102 |
| 2005/0207120 A1 | 9/2005 | Tseng et al. | |
| 2005/0217829 A1* | 10/2005 | Belits et al. | 165/104.33 |
| 2005/0257532 A1* | 11/2005 | Ikeda et al. | 62/3.7 |
| 2005/0270747 A1 | 12/2005 | Rogers et al. | |
| 2006/0096743 A1* | 5/2006 | Lee et al. | 165/104.33 |
| 2006/0209266 A1 | 9/2006 | Utsunomiya | |
| 2006/0232933 A1* | 10/2006 | Wang et al. | 361/697 |
| 2006/0279706 A1 | 12/2006 | Bash et al. | |
| 2006/0290893 A1 | 12/2006 | Lim et al. | |
| 2007/0139887 A1 | 6/2007 | Lee et al. | |

FOREIGN PATENT DOCUMENTS

| | | |
|---|---|---|
| EP | 0511829 | 11/1992 |
| JP | 1988-187137 | 11/1988 |
| JP | 02-130542 | 5/1990 |
| JP | 05-264947 | 10/1993 |
| JP | 10-333129 | 12/1998 |
| JP | 2002156195 | 5/2002 |
| JP | 2003-57754 | 2/2003 |
| JP | 2004126255 | 4/2004 |
| JP | 2004283304 | 10/2004 |
| JP | 2004287189 | 10/2004 |
| KR | 1998-038287 | 8/1998 |
| KR | 100319217 | 12/2001 |
| KR | 2002-0008902 | 2/2002 |
| KR | 2003-49910 | 6/2003 |
| KR | 2005-22746 | 3/2005 |
| WO | 2005/017615 | 2/2005 |

OTHER PUBLICATIONS

Korean Office Action dated Aug. 21, 2006 issued in KR 2005-33186.
Chinese Office Action issued May 8, 2009 in CN Application No. 2006100767803.
United States Office Action dated May 13, 2010 in U.S. Appl. No. 11/489,489.
United States Office Action dated Jun. 1, 2009 in U.S. Appl. No. 11/489,489.
United States Office Action dated Dec. 3, 2010 in U.S. Appl. No. 11/489,489.
United States Office Action dated Dec. 24, 2009 in U.S. Appl. No. 11/489,489.
United States Office Action dated Apr. 20, 2011 in U.S. Appl. No. 11/489,489.
United States Office Action issued Aug. 3, 2011 in U.S. Appl. No. 11/489,489.
Chinese Office Action issued Aug. 29, 2008 in CN Application 2006100767803.
Chinese Office Action issued Feb. 24, 2010 in CN Application No. 200610076780.3.
Chinese Rejection Decision issued Nov. 12, 2010 in CN Application No. 200610076780.3.
United States Office Action Issued on Jan. 25, 2012 in U.S. Appl. No. 11/489,489.
United States Office Action Issued on Apr. 24, 2012 in U.S. Appl. No. 11/489,489.

* cited by examiner

IMAGE PROJECTION APPARATUS AND METHOD OF COOLING AN IMAGE PROJECTION APPARATUS

CROSS-REFERENCE TO RELATED APPLICATIONS

This application claims priority from Korean Patent Application No. 2005-33186, filed on Apr. 21, 2005, in the Korean Intellectual Property Office, which is hereby incorporated by reference in its entirety.

BACKGROUND

1. Technical Field

The present general inventive concept relates to an image projecting apparatus containing a cooling structure that cools at least one heat generating unit accommodated in the image projecting apparatus, as well as methods for cooling an image projecting apparatus.

2. Description of the Related Art

Conventionally, an image projecting apparatus enlarges and projects an image formed by a display element onto a screen. Such a conventional image projecting apparatus includes a plurality of heat generating units that generate heat during operation. For example, a conventional image projecting apparatus often includes an optical system comprising a display element and a light source, such as a lamp, a Light Emitting Diode (LED), and the like. The display element and the light source part are both heat generating units that generate heat during operation. For example, the light source part emits both light and heat.

Recently, an image projecting apparatus has been designed to be smaller and lighter in weight. However, this reduction in size and weight has led to various problems. For example, the reduction in size has led to difficulty in the rapid discharge of heat that is generated within the apparatus to outside of the apparatus. Failure to discharge this generated heat may cause a deterioration in the function and operation of circuit components inside of the image projecting apparatus.

To protect against such a failure to discharge heat, a conventional image projecting apparatus has used a plurality of cooling fans (Korean Patent First Publication No. 2002-8902) or a guiding unit, such as a duct and the like, (Korean Patent Application No. 1996-57169), which each supply ambient air to each heat generating unit.

However, conventional image projecting apparatuses that use a plurality of cooling fans generate an increased amount of noise, and conventional image projecting apparatuses that use a guiding unit have a complicated structure. Furthermore, such conventional image projecting apparatuses are necessarily larger in size so as to accommodate the presence of the plurality of cooling fans or the guiding unit.

SUMMARY

The present general inventive concept provides an image projecting apparatus that effectively cools a plurality of heat generating units using a single cooling fan, thereby enabling image projecting apparatuses that are smaller in size while avoiding increase in noise generation and/or a complicated structure associated with a conventional image projecting apparatus, while maintaining or improving the appearance of the apparatus.

The foregoing and/or other aspects and utilities of the present general inventive concept are achieved by providing an image projecting apparatus including at least one heat generating unit, a main body frame to support the at least one heat generating unit; a heat dispersion part provided in a part of the main body frame, at least one heat transfer member having a first side connected to the at least one heat generating unit and a second side connected to the heat dispersion part to transfer heat from the at least one heat generating unit to the heat dispersion part, and a single cooling fan that cools the at least one heat transfer member.

Additional aspects and advantages of the present general inventive concept will be set forth in part in the description which follows and, in part, will be obvious from the description, or may be learned by practice of the general inventive concept.

In embodiments, the image projecting apparatus includes a plurality of heat generating units and a plurality of heat transfer members. The heat transfer members may include, for example, a heat pipe or a heat transfer plate. At least one of the plurality of heat transfer members may include a heat pipe, and at least one of the plurality of heat transfer members may include a heat transfer plate. In embodiments, the heat transfer plate is provided with a plurality of air holes formed inside the heat transfer plate in a lengthwise direction of the heat transfer plate to direct from the heat generating unit to the heat dispersion part. The phrase "inside the heat transfer plate" means entirely within the structure of the heat transfer plate, such that the holes are not present on the outer surfaces of the heat transfer plate.

A first side of each of the heat transfer members is connected to a corresponding heat generating unit, and a second side of each of the heat transfer members is connected to the heat dispersion part. The term "connected" encompasses both a direct connection and an indirect connection. For example, the heat transfer members may be indirectly connected directly to the corresponding heat generating units, or they may be connected to the corresponding heat generating units by an intervening component. For example, where the heat transfer member includes a heat pipe, an absorption plate may be position between the heat pipe and the corresponding heat generating unit, thus indirectly-connecting the heat pipe to the corresponding heat generating unit. The absorption plate transfers the heat generated by the heat generating unit to the heat pipe.

The image projecting apparatus may also include a heat sink connected to each of the heat transfer members. The heat sink may be positioned in the heat dispersion part.

The heat generating unit may be, for example, a display element for forming an image, a driving part for driving the display element, or a light source part for supplying light to the display element. In embodiments, a first heat transfer member is connected to the display element and the heat dispersion part, a second heat transfer member is connected to the driving part and the heat dispersion part, and a third heat transfer member is connected to the light source part and the heat dispersion part. The third heat transfer member may include a heat pipe. In addition, at least one of the first heat transfer member and the second heat transfer member may include a heat transfer plate.

The foregoing and other aspects and utilities of the present general inventive concept may also be achieved by providing an image projecting apparatus including a display element to form an image; a driving part to drive the display element; a light source part to supply light to the display element; a main body frame to support the display element, the driving part, and the light source part; a first heat transfer member connected to the display element to transfer heat; a second heat transfer member connected to the driving part and the first heat transfer member to transfer the heat; a third heat transfer member connected to the light source part and the first heat transfer member to transfer the heat; and a cooling fan to cool the first heat transfer member.

The image projecting apparatus may further include a heat sink to transfer the heat to the first heat transfer member. The cooling fan cools the first heat transfer member, for example, by distributing the heat toward the heat sink.

The display element and the light source part may be positioned at one side of the main body frame, parallel to one another, and the first heat transfer member may be connected to the light source part to transfer the heat. The heat sink and the cooling fan may be positioned on an opposite side of the main body frame.

Additional embodiments of the general inventive concept will be set forth in the description and figures that follow.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF EMBODIMENTS

Figure 1:
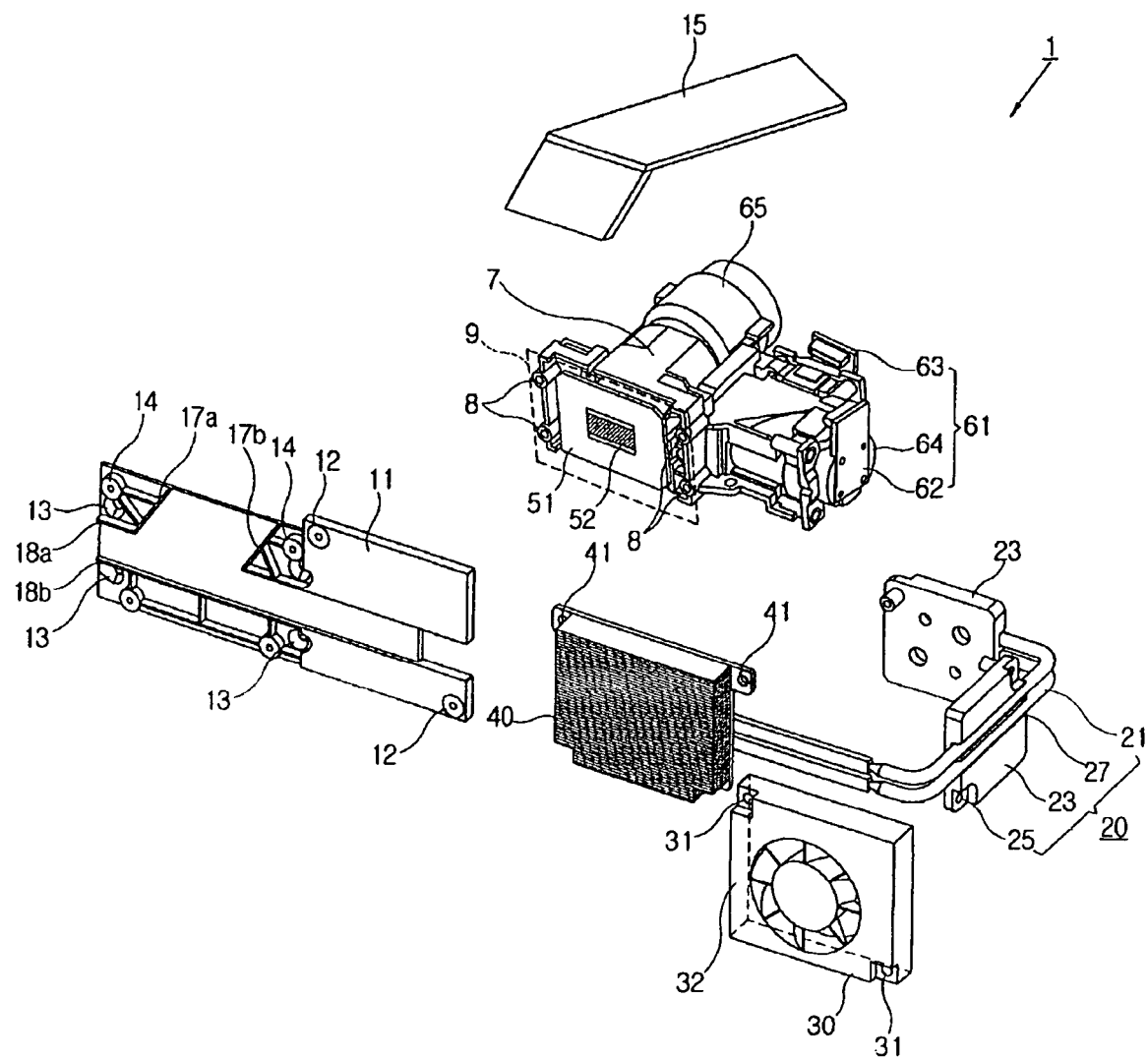
FIG. 1 is an exposed perspective view illustrating an image projecting apparatus according to an embodiment of the present general inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

Figure 2:
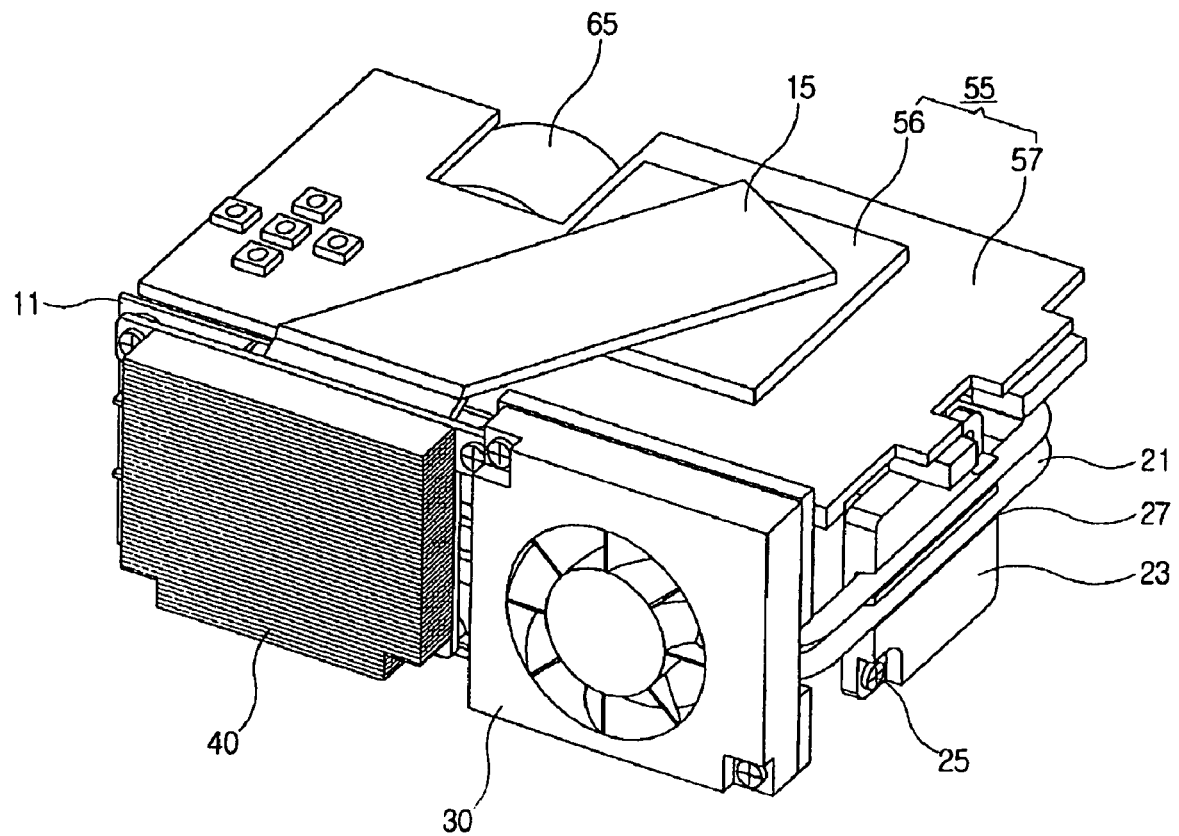
FIG. 2 is a perspective view illustrating an air hole formed at a second heat transfer member of the image projecting apparatus of FIG. 1.
Figure 3:
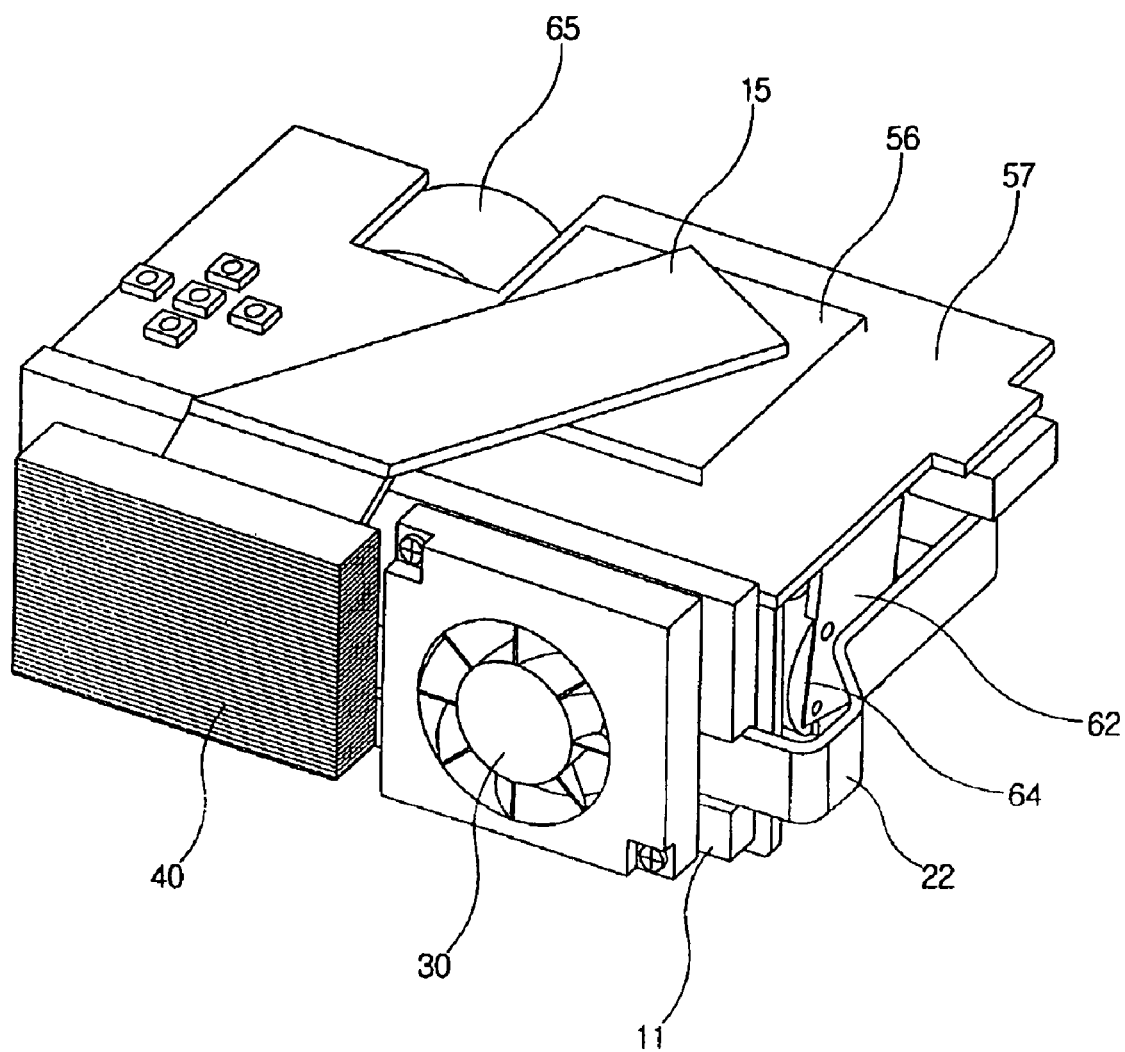
FIG. 3 is an assembled perspective view illustrating the image projecting apparatus of FIG. 1.

FIG. 1 is an exposed perspective view illustrating an image projecting apparatus according to an embodiment of the present general inventive concept. As illustrated in FIGS. 1-3, the image projecting apparatus 1 may include a housing (such as the housing 3 illustrated in FIG. 5), a main body frame 7 accommodated in the housing, a plurality of heat generating units 51, 55, and 61 supported by the main body frame 7 to generate heat during operation, cooling devices 11, 15, 20, 30, and 40 to cool the heat generating units 51, 55, and 61, and a projecting lens part 65.

The heat generating units may be selected from a light source part that emits light, a display element that forms an image from the light, and a driving part to drive the display element. For example, as illustrated in FIGS. 1-3, the image projecting apparatus may include a light source part 61, a display element 51, and a driving part 55.

The cooling devices may be selected from a heat dispersion part, a heat sink, one or more heat transfer members, and a single cooling fan. For example, as illustrated in FIGS. 1-3, the image projecting apparatus may include a heat dispersion part 9 provided in a part of the main body frame 7, a heat sink 40, a plurality of heat transfer members 11, 15, and 20 connected to the heat generating units 51, 55, and 61 and connected to the heat sink 40 to transfer the heat, and a cooling fan 30 to cool the heat sink 40.

The light source part 61 includes a light source to emit light and light source substrates 62, 63 to drive the light source. The light source part may be, for example, a gas-discharge lamp of an arc type, such as a mercury lamp, a metal halide lamp, and a xenon lamp.

As illustrated in FIG. 1, the light source of the light source part 61 may be, for example, an LED or a plurality of LEDs. The plurality of LEDs may each emit light of the same or different colors, for example red light, green light, blue light, and the like. Furthermore, the plurality of LEDs may be coupled to LED substrates to support and drive the LEDs. For example, an LED emitting green light may be supported by a first LED substrate, such as substrate 62 in FIG. 1. Similarly, an LED emitting blue light and red light may be supported by a second LED substrate, such as substrate 63 in FIG. 1. As illustrated in FIG. 1, the sides of the LED substrates 62 and 63 may include a heat radiating plate 64 to emit the heat generated from the LED.

The display element 51 generates an image signal by using the light emitted from the light source part 61. As illustrated in FIG. 1, the display element 51 may include a Digital MicroMirror Device (DMD) panel 52. Alternatively, the display element 51 may include a Cathode Ray Rube (CRT) panel or a Liquid Crystal Display (LCD) panel.

FIG. 3 is an assembled perspective view illustrating the image projecting apparatus of FIG. 1. As illustrated in FIGS. 2 and 3, the driving part 55 is electrically connected to the display element 51 and drives the display element 51 to generate the image. The driving part 55 includes a driving chip 56 and a main board 57. In embodiments, the driving chip 56 may use a Digital Light Processor (DLP) chip.

As illustrated in FIG. 1, the heat dispersion part 9 may be located in the main body frame 7. The heat generated from the operation of the heat generating units 51, 55, and 61 is transferred through the heat transfer members 11, 15, and 20, is collected at the heat dispersion part 9, and is discharged outside of the image projecting apparatus 1 by the cooling fan 30. The heat dispersion part 9 may be positioned at any location in the main body frame 7. For example, as illustrated in FIG. 1, the heat dispersion part 9 may be positioned in a side of the display element 51. Alternatively, the heat dispersion part 9 may be positioned, for example, in a side of the light source part 61. Where the heat dispersion part 9 is provided on the side of the display element 51, the heat from the driving part 55 and the light source part 61 is collected at the first heat transfer member 11. When the heat dispersion part 9 is provided on the side of the light source part 61, the heat from the display element 51 and the driving part 55 is collected at the third heat transfer member 20.

As illustrated in FIGS. 1-3, the first heat transfer member 11 cools the display element 51, the second heat transfer member 15 cools the driving part 55, and the third heat transfer member 20 cools the light source part 61. Specifically, the first heat transfer member 11 is connected to the display element 51 and absorbs the heat generated by the operation of the display element 51. The heat absorbed by the first heat transfer member 11 is transferred to the heat dispersion part 9, and is discharged outside of the image projecting apparatus 1.

The first heat transfer member 11 may be directly connected to the display element 51, or may be indirectly connected to the display element 51 through an intervening supporting member. For example, a supporting member may be interposed between the display element 51 and the first heat transfer member 11, indirectly connecting the display element 51 and the first heat transfer member 11. The supporting member may be any material having high heat conductivity such that heat is suitably-transferred from the display element 51 to the first heat transfer member 11.

The first heat transfer member 11 is not limited to being a specific size, and thus can be any size that is suitable for the corresponding image projecting apparatus. For example, as illustrated in FIG. 1, the size of the first heat transfer member 11 may correspond to the size of the display element 51, and may be of a sufficient size to cover the entire rear of the image projecting apparatus 1. Also as illustrated in FIG. 1, the first heat transfer member 11 can be connected to a side of the light source part 61 as well as to the display element 51, and can absorb heat generated from the light source part 61. Furthermore, the first heat transfer member 11 may include a main body coupling hole 13 to couple to the main body frame 7, a heat sink coupling hole 14 to couple to the heat sink 40, and a cooling fan coupling hole 12 to couple to the cooling fan 30. In addition, the first heat transfer member 11 may further include first guide parts 17a and 17b to accommodate the second heat transfer member 15, and second guide parts 18a and 18b to accomodate the third heat transfer member 20.

As illustrated in FIGS. 2 and 3, opposite sides of the second heat transfer member 15 are connected to the driving chip 56 of the driving part 55 and the heat sink 40. The second heat transfer member 15 transfers heat generated from the driving part 55 to the heat dispersion part 9. The second heat transfer member 15 may be directly or indirectly connected to the heat sink 40. Moreover, the shape of the second heat transfer member 15 may vary so as to increase heat transfer efficiency.

Figure 6:
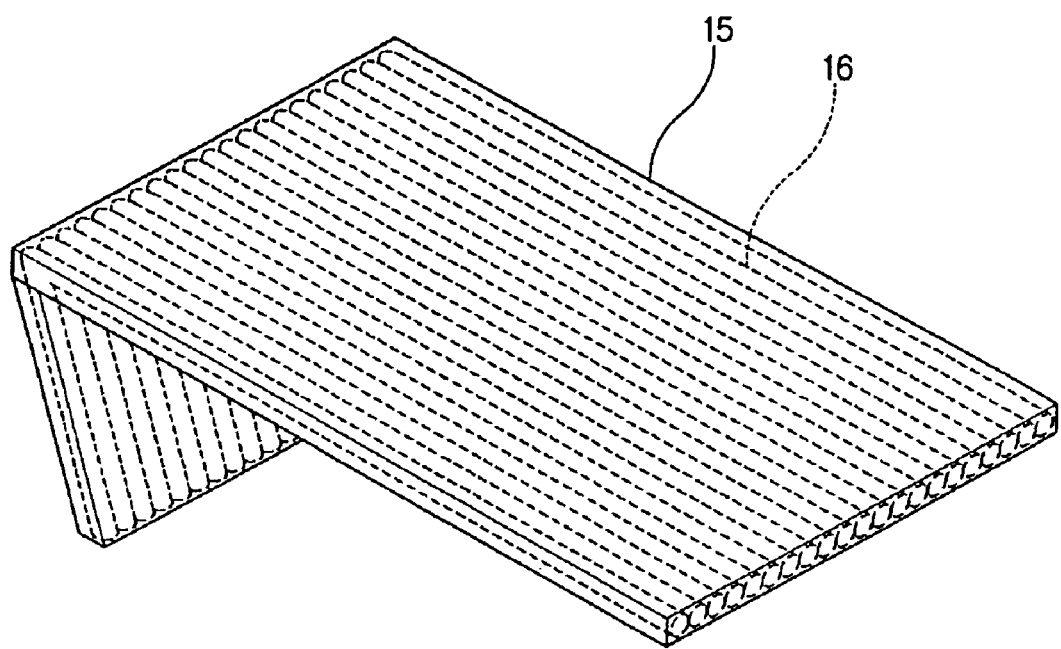
FIG. 6 is a perspective view illustrating the front portion of the image projecting apparatus of FIG. 1, according to an embodiment of the present general inventive concept.

As illustrated in FIG. 6, the second heat transfer member 15 may include a plurality of air holes 16 formed inside of the second heat transfer member 15 in a lengthwise direction thereof, enabling air to flow from the driving part 55 toward the heat sink 40. The phrase "inside the second heat transfer member 15" means entirely within the structure of the second heat transfer member 15, such that the holes are not present on the outer surfaces of the second heat transfer member 15, as illustrated in FIG. 6. As illustrated in FIGS. 2, 3, and 6, opposite sides of the air holes 16 may be formed with openings contacting the driving part 55 and the heat sink 40, respectively. The air flows through the air holes 16 so that heat generated by the driving part 55 may be transferred to the heat sink 40 as the heat is generated. In embodiments, the first heat transfer member 11 may also include a plurality of air holes 16 formed inside of the first heat transfer member 11. Furthermore, the first heat transfer member 11 may be integrally-attached to the second heat transfer member 15.

As illustrated in FIG. 1, the third heat transfer member 20 may have a first side which is connected with the light source part 61, and a second side which is connected with the first heat transfer member 11 and/or to the heat sink 40, enabling the third heat transfer member 20 to transfer heat generated by the light source part 61 to the heat sink 40. The third heat transfer member 20 may also be connected to the first LED substrate 62 and/or to the second LED substrate 63.

In embodiments, the third heat transfer member 20 includes a heat pipe 21, as illustrated in FIGS. 1 and 2. The heat pipe 21 may be, for example, a hollow sealed pipe. The inside wall surface of the hollow sealed pipe may include a porous material, which may be saturated with a very small amount of liquid working fluid, such as water, ethanol, acetone or the like. The working fluid inside of the heat pipe 21 absorbs heat and gasifies at a side of the heat pipe 21 that is connected to the light source part 61 (the "high temperature" part of the heat pipe 21). The gasified working fluid is condensed at a side of the heat pipe that is connected to the heat sink 40 (the "low temperature" part of the heat pipe 21) to discharge the heat outside of the image projecting apparatus 1. The condensed working fluid in the low temperature part of the heat pipe 21 then diffuses back to the high temperature part of the heat pipe 21 due to a difference in the capillary pressures of the low and high temperature parts of the heat pipe 21, which is generated at an interface of porous material between the low temperature part and the high temperature part, thereby circulating the working fluid in a cooling cycle.

In embodiments, one or more of the heat transfer members may include a single heat pipe or multiple heat pipes, such as two heat pipes, three heat pipes, or more than three heat pipes. For example, as illustrated in FIG. 1, the third heat transfer member may include two heat pipes 21. Similarly, the first heat transfer member and/or the second heat transfer member 15 may include one or more heat pipes 21. In addition, in embodiments, one or more of the heat transfer members may include a heat transfer plate 22. The heat transfer plate is not limited to being a specific shape, and thus can be any shape that is suitable for the corresponding image projecting apparatus. For example, as illustrated in FIG. 3, the third heat transfer member 20 may include a heat transfer plate 22. Similarly, the first heat transfer member 11 and/or the second heat transfer member 15 may include a heat transfer plate 22.

Figure 4:
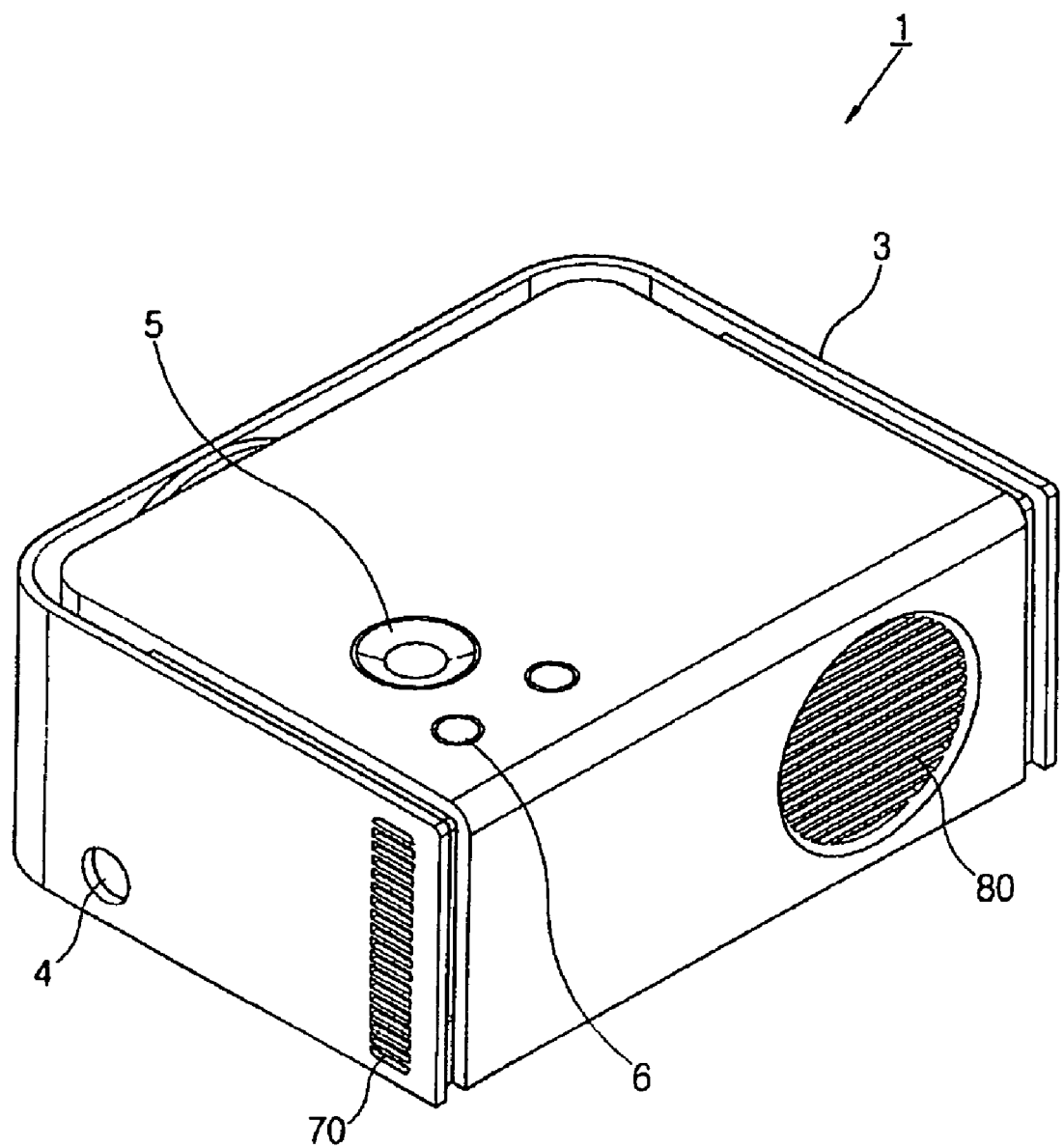
FIG. 4 is an assembled perspective view illustrating an image projecting apparatus according to another embodiment of the present general inventive concept.

Furthermore, the first heat transfer member 11 and the second heat transfer member 15 may be provided as a heat pipe. The heat absorption plate 23 may be provided between the light source part 61 and the third heat transfer member 20. A first side surface of the heat absorption plate 23 may be contacted with the light source part 61 to absorb the heat from the light source part 61, and a second side surface thereof may be provided with an accommodating part 27 to accommodate the third heat transfer member 20 to transfer the heat to the third heat transfer member 20. The accommodating part 27 enlarges a contact width of the heat absorption plate 23 and the third heat transfer member 20, to enlarge an absorbing width of the third heat transfer member 20. Thus, a large amount of heat from the light source part 61 may be transferred to the third heat transfer member 20. A shape and a size of the accommodating part 27 may be changed according to the third heat transfer member 20. For example, when the third heat transfer member 20 is provided as the heat pipe 21, a section of the accommodating part 27 may have a semicircle shape (see FIG. 1). When the third heat transfer member 20 is provided as the heat transfer plate 22, as illustrated in FIG. 4, the absorption plate 23 may have a rectangle shape. Moreover, a side of the absorption plate 23 may be provided with a fastening part 25 to fasten the absorption plate 23 to the light source part 61.

As illustrated in FIG. 1, the image projecting apparatus may also include a heat absorption plate 23 positioned between the light source part 61 and the third heat transfer member 20. The heat absorption plate 23 is not limited to being a specific shape and size, and thus may be any suitable size and shape. For example, as illustrated in FIGS. 1-3, the absorption plate 23 may have a rectangle shape, such as where the third heat transfer member 20 includes the heat transfer plate 22.

As illustrated in FIG. 1, the surface of a first side of the heat absorption plate 23 contacts the light source part 61 to absorb heat generated by the operation of the light source part 61. The surface of a second side of the heat absorption plate 23 may include an accommodating part 27 to accommodate the third heat transfer member 20, enabling the transfer of heat to the third heat transfer member 20. The accommodating part 27 enlarges the area of contact between the heat absorption plate 23 and the third heat transfer member 20, thereby increasing the area of the surface of the third heat transfer member 20 that is available to absorb heat from the light source part 61. Thus, the accommodating part 27 increases the amount of the heat that can be transferred from the light source part 61 to the third heat transfer member 20.

The shape and size of the accommodating part 27 is not limited to being a specific shape and size, and thus may be any suitable shape and size. For example, as illustrated in FIG. 1, a section of the accommodating part 27 may be formed as a semicircle shape, such as where the third heat transfer member 20 includes heat pipe 21. In addition, a side of the absorption plate 23 may include a fastening part 25 to fasten the absorption plate 23 to the light source part 61, as illustrated in FIGS. 1 and 2.

The heat transfer members 11, 15, 20 and the absorption plate 23 are not limited to being a specific material, and may be any material having good heat conductivity. For example, one or more of the heat transfer members and the absorption plate may include copper, stainless, titanium and the like, and mixtures thereof.

As illustrated in FIG. 1, the heat sink 40 can be positioned at the heat dispersion part 9. Furthermore, the heat sink 40 can be connected to the first heat transfer member 11, the second heat transfer member 15, and the third heat transfer member 20, enabling the heat sink 40 to transfer heat through each heat transfer member 11, 15, and 20, and to discharge the heat outside of the image projecting apparatus 1.

The heat sink 40 radiated by cooling air generated by the cooling fan 30 is the low temperature part relative to the temperatures of heat generating units 51, 55, and 61. In particular, the heat generated from the heat generating units 51, 55, 61 collects in the heat sink 40 through the first heat transfer member 11, the second heat transfer member 15, and the third heat transfer member 20. The heat sink 40 enlarges the contact width with the cooling air, and may be have a various shape to increase cooling efficiency. For example, it may be provided as a cooling fin having a plurality of projections at a surface of the cooling fin (see FIG. 6). When the heat sink 40 connects with the first heat transfer member 11, the second heat transfer member 15, and the third heat transfer member 20, the heat sink 40 may be positioned in any inner place of the image projecting apparatus 1 without limitation. For example, as illustrated in FIG. 1, the heat sink 40 may be positioned in the rear the image projecting apparatus 1 close to the display element 51, and at a lateral surface of the image projecting apparatus 1 close to the light source part 61.

The heat sink 40 is cooled by cooling air distributed by the cooling fan 30. Thus, the temperature of the heat sink 40 is lower relative to the temperature of the heat generating units 51, 55, and 61. The heat generated by the operation of the heat generating units 51, 55, and 61 collects in the heat sink 40 through the first heat transfer member 11, the second heat transfer member 15, and the third heat transfer member 20. The heat sink 40 enables the heat transferred from the heat transfer members 11, 15, and 20 to contact the cooling air provided by the cooling fan 30.

The heat sink may be any shape suitable for increasing cooling efficiency. For example, as illustrated in FIG. 1, the heat sink may be a cooling fin having a plurality of projections at its surface. In embodiments, such as where the heat sink 40 connects with the heat transfer members 11, 15, and 20 the heat sink 40 may be positioned at any internal location of the image projecting apparatus 1 without limitation. For example, as illustrated in FIGS. 1-3, the heat sink 40 may be positioned in the rear of the image projecting apparatus 1, close to the display element 51. Alternatively, the heat sink 40 may be positioned, for example, at a lateral surface of the image projecting apparatus 1, close to the light source part 61.

In embodiments, the cooling fan 30 distributes cooling air toward the heat sink 40 and discharges the heat from the heat sink 40 outside of the image projecting apparatus. The cooling fan 30 may be positioned at any internal location of the image projecting apparatus 1 without limitation. For example, the cooling fan 30 may be positioned so that air inhaled through the cooling fan 30 is distributed to the heat sink 40 by the shortest possible pathway in an effort to maximally-decrease the size of the image projecting apparatus 1. In particular, as illustrated in FIGS. 1-3, the cooling fan 30 may be provided in the rear of the image projecting apparatus 1, parallel with the heat sink 40. Alternatively, the cooling fan 30 may be positioned at a lateral surface of the image projecting apparatus 1 to parallel with the heat sink 40, such as where the heat sink 40 is positioned at a lateral surface of the image projecting apparatus 1.

The cooling fan may be any fan suitable for cooling the heat transfer members and/or the heat sink, and suitable to discharge heat to outside of the image projecting apparatus. In embodiments, the cooling fan can be a radial flow fan that discharges the cooling air in a radial direction of a rotating axis of the fan. For example, the cooling 30 fan may be a Sirocco fan. Furthermore, cooling fan may include a penetrating hole to help in the distribution of the cooling air from the cooling fan 30.

Figure 5:
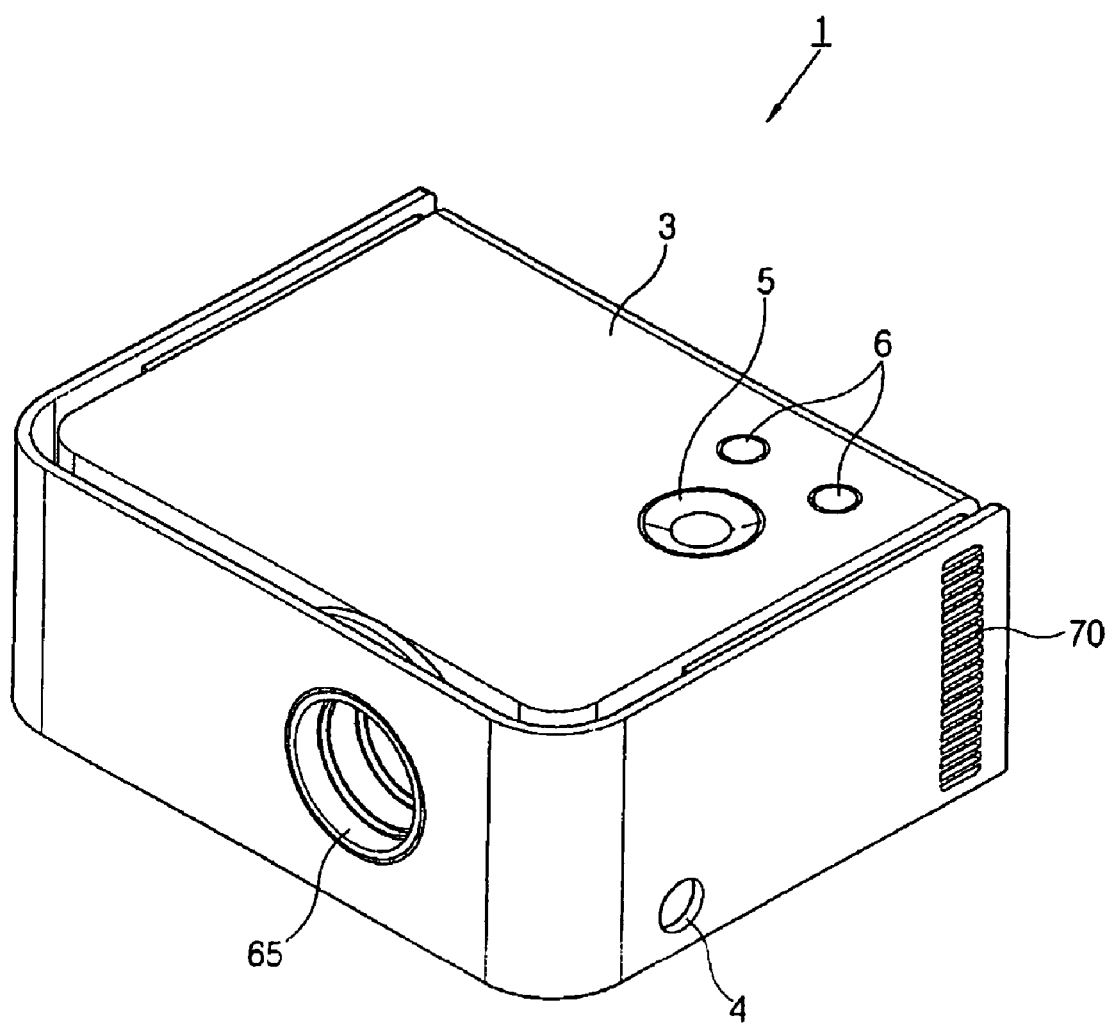
FIG. 5 is a perspective view illustrating the rear portion of the image projecting apparatus of FIG. 1, according to an embodiment of the present general inventive concept.

As illustrated in FIG. 4, the housing 3 of the image projecting apparatus 1 may include an inlet 80 to supply outside air to the cooling fan 30, and an exhaust hole 70 to discharge hot air passing through the heat sink 40 to outside of the image projecting apparatus 1. The inlet 80 and the exhaust hole 70 can be positioned at any internal location of the housing 3 without limitation. For example, as illustrated in FIG. 4, the inlet 80 can be positioned in a side of the housing 3 corresponding to a position of the cooling fan 30, so that the cooling fan 30 can directly inhale the outside air. As illustrated in FIG. 4, the exhaust hole 70 can be positioned adjacent to the heat sink 40, for example at a side of the housing 3 that is perpendicular to the side on which the inlet 80 is positioned, so that the cooling air generated by the cooling fan 30 is discharged directly to the outside from the heat sink 40. Furthermore, the housing 3 may further include a cable hole 4 for an electric power cable, a power key 5 to turn on/off the image projecting apparatus 1, and/or a function key 6 for operation of the image projecting apparatus 1, as illustrated in FIGS. 4 and 5.

Embodiments of a process for cooling an image projecting apparatus will be described with reference to FIGS. 1-3.

A heat transfer member 11 absorbs heat generated by the operation of a display element 51, which is connected to a first side of the heat transfer member 11 at a rear portion of image projecting apparatus 1. The heat is then transferred from the heat transfer member 11 to the heat sink 40, which is connected to a second side of the heat transfer member 11. A heat transfer member 15 absorbs heat generated by the operation of a driving part 55, which is connected to a first side of the heat transfer member 15. The heat is then transferred from the heat transfer member 15 to the heat sink, which is connected to a second side of the heat transfer member 15. A heat transfer member 20 absorbs the heat generated by the operation of a light source part 61, which is connected to a first side of the heat transfer member 20. The heat is then transferred from the heat transfer member 20 to the heat sink 40, which is connected to a second side of the transfer member 20.

The transfer of heat from the heat generating device(s) to the heat transfer member(s) need not occur in any particular order. In particular, the transfer of heat from the display element 51, the driving part 55, and the light source part 61 to the respective transfer members 11, 15, and 20 need not occur in any particular order. For example, the transfer of heat from the display element 51 to the heat transfer member 11 can occur at the same time as, or at a different time from, the transfer of heat from the driving part 55 to the heat transfer member 15 and the transfer of heat from the light source part 61 to the transfer member 20. Similarly, the transfer of heat from the driving part 55 to the heat transfer member 15 can occur at the same time as, or at a different time from, the transfer of heat from the light source part 61 to the transfer member 20. In addition, the transfer of heat from the display element 51, the driving part 55, and the light source part 61 to the respective transfer members 11, 15, and 20 can occur sequentially, simultaneously, randomly, or in any order.

Similarly, the transfer of heat from the heat transfer member(s) to the heat sink need not occur in any particular order. In particular, the transfer of heat from the heat transfer members 11, 15, and 20 to the heat sink 40 need not occur in any particular order. For example, the transfer of heat from the heat transfer member 11 to the heat sink 40 can occur at the same time as, or at a different time from, the transfer of heat from the heat transfer member 14 to the heat sink 40 and the transfer of heat from the heat transfer member 20 to the heat sink 40. Similarly, transfer of heat from the heat transfer member 14 to the heat sink 40 can occur at the same time as, or at a different time from, the transfer of heat from the heat transfer member 20 to the heat sink 40. In addition, the transfer of heat from the heat transfer members 11, 15, and 20 to the heat sink 40 can occur sequentially, simultaneously, randomly or in any order.

A cooling fan 30 can be positioned adjacent to the heat sink 40, and distributes cooling air toward the heat sink 40. Upon absorbing the heat from the heat sink 40, the hot air is discharged to the outside of the image projecting apparatus through the exhaust hole 70, which can be positioned adjacent to the heat sink.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. An image projecting apparatus, comprising:
a main body frame having an interior portion and an exterior portion;
a heat sink connected to the exterior portion of the main body frame;
a display element adjacent the heat sink to form an image through a projecting lens;
a driving part to drive the display element;
a light source part to supply light to the display element;
a heat dispersion part provided in a part of the main body frame between the heat sink and the display element to collect heat generated from the display element, driving part and light source part and to transfer the collected heat to the heat sink;
a first heat transfer member connecting to the display element, the light source part and the heat dispersion part, and coupled to the main body frame;
a second heat transfer member having a first portion connecting to the driving part and a second portion connecting to the first heat transfer member, the second portion disposed between the heat sink and the display element; and
a single cooling fan disposed adjacent the heat sink to cool the heat sink and the heat dispersion part.

2. The image projecting apparatus of claim 1, wherein a first side of each of the heat transfer members is connected to at least one heat generating unit, and a second side of each heat transfer member is connected to the heat dispersion part.

3. The image projecting apparatus of claim 1, wherein the heat dispersion part comprises a second heat sink.

4. The image projecting apparatus of claim 1, wherein the at least one heat transfer member comprises at least one heat pipe.

5. The image projecting apparatus of claim 1, wherein the at least one heat transfer member comprises a heat transfer plate.

6. The image projecting apparatus of claim 1, further comprising: a first heat transfer member having opposite sides thereof connected to the display element and the heat dispersion part, a second heat transfer member having opposite sides thereof connected to the driving part and the heat dispersion part, and a third heat transfer member having opposite sides thereof connected to the light source part and the heat dispersion part.

7. The image projecting apparatus of claim 1, wherein the light source part comprises an LED.

8. The image projecting apparatus of claim 1, wherein the single cooling fan is connected to a lateral side of the heat dispersion part.

9. The image projecting apparatus of claim 4, wherein the at least one heat transfer member comprises two heat pipes.

10. The image projecting apparatus of claim 4, further comprising a heat absorption plate between the heat generating unit and the at least one heat pipe.

11. The image projecting apparatus of claim 5, wherein the heat transfer plate comprises a plurality of air holes inside of the heat transfer plate in a lengthwise direction of the heat transfer plate.

12. The image projecting apparatus of claim 6, wherein the third heat transfer member comprises at least one heat pipe.

13. The image projecting apparatus of claim 6, wherein at least one of the first heat transfer member and the second heat transfer member comprises a heat transfer plate.

14. The image projecting apparatus of claim 12, wherein the third heat transfer member comprises two heat pipes.

15. An image projecting apparatus, comprising:
a display element to form an image;
a driving part to drive the display element;
a light source part to supply light to the display element;
a main body frame to support the display element, the driving part, and the light source part;
a heat dispersion part to collect heat generated from the display part element, driving part and light source part and transfer the collected heat to a heat sink mounted to an exterior part of the image projecting apparatus;
a first heat transfer member connected to the display element and the heat dispersion part;
a second heat transfer member having a first portion connected to the driving part and a second portion connected to the first heat transfer member, the second portion disposed between the heat sink and the display element;
a third heat transfer member connected to the light source part and to the first heat transfer member; and a single cooling fan adjacent the heat sink to cool the heat sink and the heat dispersion part.

16. The image projecting apparatus of claim 15, wherein the heat sink is connected to at least one of the first, second, and third heat transfer members, such that the cooling fan distributes air to the heat sink.

17. The image projecting apparatus of claim 15, wherein the display element and the light source part are positioned on a first side of the main body frame, parallel to one another, and the first heat transfer member is connected to the light source part.

18. The image projecting apparatus of claim 15, wherein the third heat transfer member comprises at least one heat pipe.

19. The image projecting apparatus of claim 15, wherein the second heat transfer member comprises a plurality of air holes inside of the second heat transfer member in a lengthwise direction of the second heat transfer member.

20. The image projecting apparatus of claim 17, wherein the heat sink and the cooling fan are each positioned on a second side of the main body frame that is opposite to the first side of the main body frame.

21. The image projecting apparatus of claim 18, wherein the third heat transfer member comprises two heat pipes.

22. An image projecting apparatus, comprising:
a main body frame having an interior and an exterior;
at least two heat generating units spaced apart from each other;
a heat dispersion part to collect heat generated from a display element, driving part and light source part;
a heat sink mounted to the exterior of the main body frame to which heat generated by the at least two heat generating units is transferred through the at least two heat transfer members and through the heat dispersion part;
a first heat transfer member connected to the display element and the heat dispersion part; and
a second heat transfer member having a first portion connected to the driving part and a second portion connected to the first heat transfer member, the second portion disposed between the heat sink and the display element,
wherein a portion of the first heat transfer member is disposed between the second heat transfer member and the heat sink, and
wherein the at least two heat generating units comprise the display element to form an image, a driving part to drive the display element, and a light source part to supply light to the display element.

23. The image projecting apparatus of claim 22, wherein a guide part is provided in the second heat transfer member in order to accommodate the first heat transfer member.

24. The image projecting apparatus of claim 22, wherein the heat sink and the second heat transfer member are coupled with each other.

* * * * *